United States Patent
Jayaraman et al.

(10) Patent No.: US 9,515,663 B2
(45) Date of Patent: Dec. 6, 2016

(54) DYNAMIC PRESCALING FOR PERFORMANCE COUNTERS

(71) Applicant: INTERNATIONAL BUSINESS MACHINES CORPORATION, Armonk, NY (US)

(72) Inventors: Prasanna Jayaraman, Austin, TX (US); Charles F. Marino, Round Rock, TX (US); Srinivas B. Purushotham, Bangalore (IN); Srinivasan Ramani, Cary, NC (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/182,052

(22) Filed: Jun. 14, 2016

(65) Prior Publication Data

US 2016/0294396 A1 Oct. 6, 2016

Related U.S. Application Data

(62) Division of application No. 14/472,995, filed on Aug. 29, 2014, now Pat. No. 9,419,625.

(51) Int. Cl.
*H03K 21/40* (2006.01)
*H03K 21/02* (2006.01)

(52) U.S. Cl.
CPC ............ *H03K 21/023* (2013.01); *H03K 21/40* (2013.01)

(58) Field of Classification Search
CPC .............................. H03K 21/023; H03K 21/40
USPC ............................. 377/51, 44, 33, 26, 15, 27
See application file for complete search history.

(56) References Cited

U.S. PATENT DOCUMENTS

| | | | |
|---|---|---|---|
| 6,066,990 A * | 5/2000 | Genest | H03L 7/193 327/115 |
| 8,514,999 B2 | 8/2013 | Frazier et al. | |
| 9,419,625 B2 | 8/2016 | Jayaraman et al. | |
| 2005/0117692 A1* | 6/2005 | Hunter | G07C 11/00 377/15 |
| 2005/0165569 A1* | 7/2005 | Matsui | G01R 29/02 702/79 |

(Continued)

OTHER PUBLICATIONS

"List of IBM Patents or Patent Applications Treated as Related" 1 page.

*Primary Examiner* — Lincoln Donovan
*Assistant Examiner* — Thomas Skibinski
(74) *Attorney, Agent, or Firm* — Randall J. Bluestone; Andrew M. Calderon; Roberts Mlotkowski Safran Cole & Calderon (57) ABSTRACT

A method of configuring a prescaling circuit in a performance counter circuit for a computer processing system can include receiving a first number of signaled events at a prescaling circuit configured to generate event counts for a performance counter circuit. The method can include generating event counts at a current event-count rate for the first number of signaled events and determining a detected event-count rate for the signaled events based on a rate at which the first number of signaled events are received at the prescaling circuit. The method can include determining that the detected event-count rate is greater than the current event-count rate. The method can include increasing the current event-count rate in response to determining that the detected event-count rate is greater than the current event-count rate.

10 Claims, 5 Drawing Sheets

(56) References Cited

U.S. PATENT DOCUMENTS

| | | | |
|---|---|---|---|
| 2009/0052608 A1* | 2/2009 | Attinella | G06F 11/348 377/15 |
| 2011/0103540 A1* | 5/2011 | Wassermann | H03K 23/667 377/26 |
| 2012/0272246 A1 | 10/2012 | Singh | |
| 2014/0086378 A1 | 3/2014 | Felten et al. | |

* cited by examiner

DYNAMIC PRESCALING FOR PERFORMANCE COUNTERS

BACKGROUND

Aspects of the present invention relate to prescaler circuits in a performance counter circuit, and more specifically, to dynamically configuring an event-count rate in a prescaler circuit for a performance counter circuit in a computer processing system.

Counters can be used to count signaled events for processes or events which are being monitored by a computer system. The signaled events can generate an event count in the counter that can keep track of the events for data logging, control, diagnostics and other functions in the system. Prescalers can be used in conjunction with counters to scale the events generated by the counters in order to reduce the occurrence of overflows from excess event counts in the counter.

SUMMARY

Aspects of the present invention are directed toward a method of configuring a prescaling circuit in a performance counter circuit for a computer processing system. The method can include receiving a first number of signaled events at a prescaling circuit configured to generate event counts for a performance counter circuit. The method can include generating event counts at a current event-count rate for the first number of signaled events and determining a detected event-count rate for the signaled events based on a rate at which the first number of signaled events are received at the prescaling circuit. The method can include determining that the detected event-count rate is greater than the current event-count rate. The method can include increasing the current event-count rate in response to determining that the detected event-count rate is greater than the current event-count rate.

Aspects of the present invention are directed toward a method including receiving a first number of signaled events at a prescaling circuit configured to generate event counts for a performance counter circuit. The method can include generating event counts at a current event-count rate for the first number of signaled events and determining, upon expiration of a sample period, a first number of event counts generated during the sample period. The method can include determining that the first number of event counts generated during the sample period triggers a lower threshold. The method can include increasing the current event-count rate in response to determining that the number of event counts generated triggers the lower threshold.

Aspects of the present invention are directed toward a system for configuring a prescaling circuit in a performance counter circuit. The system can include a performance counter circuit, a prescaling circuit, and a logic device. The prescaling circuit can be configured to receive a first number of signaled events, generate event counts for the performance counter circuit at a current event-count rate for the first number of signaled events, and increase the current event-count rate in response to receiving an increment signal. The logic device can be configured to determine a detected event-count rate for the signaled events based on a rate at which the first number of signaled events are received at the prescaling circuit, and determine that the detected event-count rate is greater than the current event-count rate. The logic device can be configured to send the increment signal to the prescaling circuit in response to determining that the detected event-count rate is greater than the current event-count rate.

The above summary is not intended to describe each illustrated embodiment or every implementation of the present invention.

BRIEF DESCRIPTION OF THE SEVERAL VIEWS OF THE DRAWINGS

The drawings included in the present application are incorporated into, and form part of, the specification. They illustrate embodiments of the present invention and, along with the description, serve to explain the principles of the invention. The drawings are only illustrative of some embodiments and do not limit the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present invention relate to performance counters, more particular aspects relate to configuring prescaler units generating event counts for performance counters. While some embodiments of the present invention are not necessarily limited to such applications, various embodiments of the invention can be appreciated through a discussion of various examples using this context.

While the same nomenclature and same numbers may be used to identify elements throughout the disclosure, this practice is not intended to limit the scope of the invention. Identified elements in one figure may not be identical to other same named or identified elements in other figures.

Aspects of the present invention are directed to a method for configuring a prescaling circuit in a counter circuit for a computer processing system. The method can include receiving a first number of signaled events at a prescaling circuit configured to generate event counts for a counter circuit.

Counters are involved in various types of computer processes to store the number of times a particular event or process has occurred. The counter can receive signals generated by the particular event or process ("signaled events"), and in response, generate a count indicating that a signal was received. Counters can be employed by various types of computer components for various purposes. For example, a processor can include a set of performance counters that monitor signals generated by hardware activities, or other types of activities that the processor is monitoring.

Prescalers are counters that can have a "divide by" value to scale the number of generated counts stored in the prescaler. The divide by value can be represented as an event-count rate, where one or more event counts are generated by the prescaler after a set number of signaled events are received at the prescaler. In some embodiments, the method for configuring a prescaling circuit in a counter circuit for a computer processing system can include generating event counts at a current event-count rate with the prescaling circuit.

The prescaler can be configured to scale event counts at various rates. For example, the prescaler could be configured to generate one event count every time the prescaler receives $2^4$ signaled events ($1:2^4$ ratio). In that instance the prescaler is referred to herein as generating event counts at a 4-bit event-count rate. The prescaler could be configured to generate one event count every time the prescaler receives $2^8$ signaled events ($1:2^8$ ratio). In that instance the prescaler is referred to as generating event counts at an 8-bit event-count rate. The prescaler could be configured to generate one event count every time the prescaler receives $2^{16}$ events ($1:2^{16}$ ratio). In that instance the prescaler is referred to as generating event counts at a 16-bit event-count rate. Additionally, the prescaler could be configured to generate one event count every time the prescaler receives $2^{20}$ events ($1:2^{20}$ ratio). In that instance the prescaler is referred to as generating event counts at a 20-bit event-count rate. However, the prescaler could be configured to generate event counts at various suitable rates.

Prescalers can be used in conjunction with performance counters to control the frequency at which the performance counters generate a count. For example, a performance counter can be coupled to a prescaling circuit such that signaled events monitored by the performance counter are first received at the prescaling unit. The prescaling unit can be configured to generate event counts at an event-count rate and submit those counts to the performance counter. The event-count rate in the prescaler can be used to increase the total allowable count in the performance counter.

For example, in a performance counter having 8 bits of data storage, the highest recordable count, without encountering an overflow, is 256. By using a prescaler configured to scale the count at a 4-bit event-count rate, the prescaler generates one event count for the performance counter each time the prescaler receives $2^4$ signaled events. Combined with the prescaler generating counts at a 4-bit event-count rate, the 8-bit performance counter could achieve a total count of 4,096 without encountering an overflow.

Thus, prescaling circuits can be used to increase the total count of the performance counter and to reduce the occurrence of the overflows in the performance circuit. However, the prescaler can reduce the resolution of the performance counter by excluding received signaled events that do not add up to the scale required to generate an event count in the prescaling unit.

Because signaled events monitored by performance counters can occur at various relative frequencies selecting an appropriate prescale for the prescaling unit that achieves a correct and accurate event count can be difficult. For example, if a lower event-count rate (more signaled events required to generate an event count) were used for rarely occurring events, the performance counter could miss signaled events. Further, if a higher event-count rate (less signaled events required to generate an event count) were used for very frequently occurring events the performance counter could encounter overflow.

In some embodiments, the method can include determining a detected event-count rate for the signaled events based on a rate at which the first number of signaled events are received at the prescaling circuit. If the detected event-count rate is greater than the current event-count rate, then the current event-count rate can be increased. Described further herein, the rate at which signaled events are received can be used to determine whether the signaled events are relatively frequent or rare. In response the current event-count rate can be dynamically adjust to more closely correspond with the frequency of the signaled events.

Figure 1:
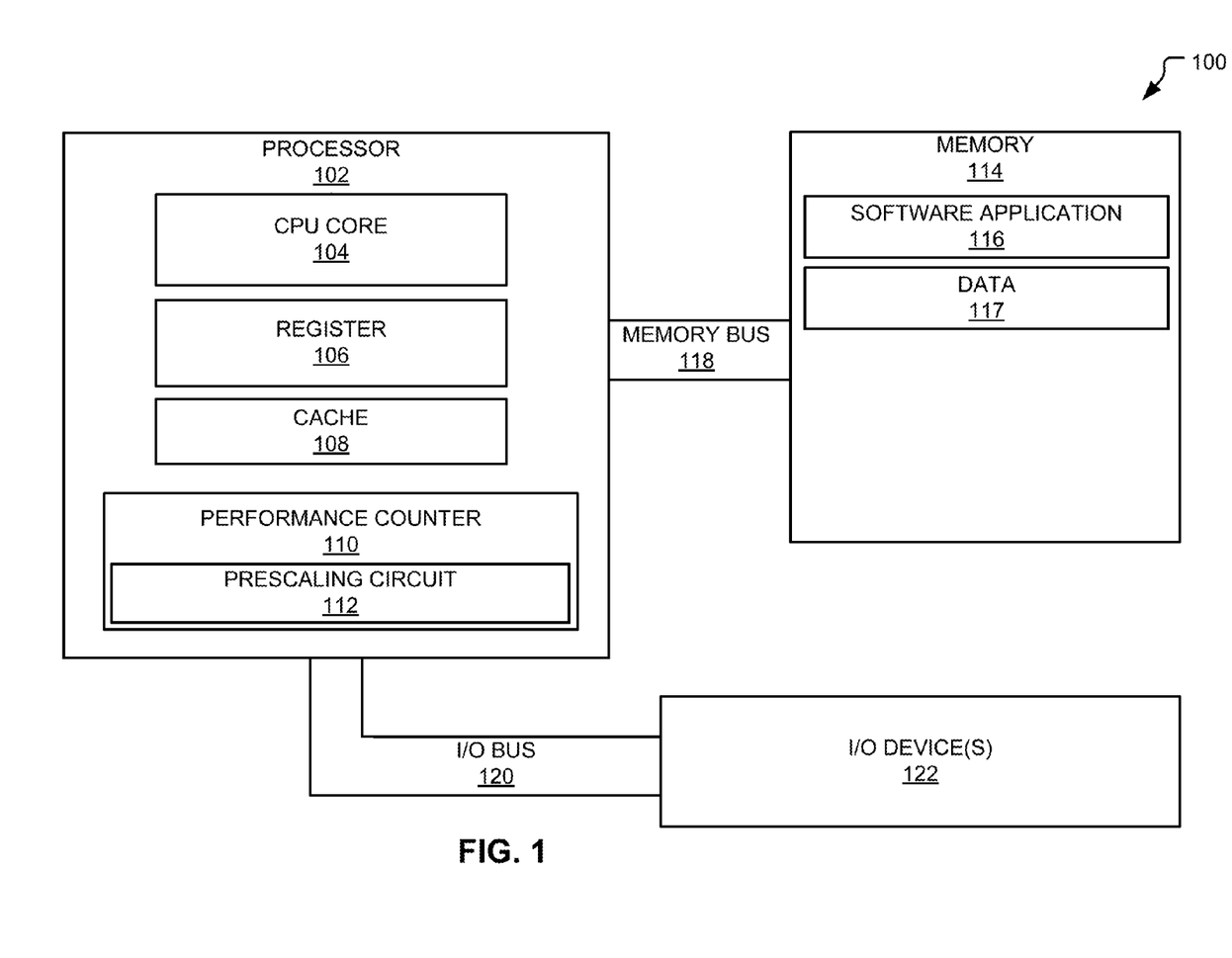
FIG. 1 depicts a computer processing system with a performance counter circuit and a prescaling circuit according to some embodiments of the present invention.

Referring now to FIG. 1, a computer processing system 100 with a performance counter circuit and a prescaling circuit can be seen according to some embodiments of the present invention. In some embodiments, the computer processing system 100 can include a processor 102, memory 114, and I/O (input/output) devices 122.

The processor 102 can execute instructions stored in memory 114 and perform various functions in the computer processing system 100. The processor 102 can include, but is not limited to, a CPU core 104, registers 106, a cache 108, and a performance counter circuit 110 which can include a prescaling circuit 112. The CPU core 104 can provide logic for the processor 102. In some embodiments, the processor 102 can contain multiple CPU cores. The cache 108 and registers 106 can provide storage for data that is frequently accessed by the processor 102. In some embodiments, the computer processing system 100 can contain multiple processors 102 typical of a relatively large system. In some embodiments, the computer processing system 100 can be a single processor system. The processor 102 can include various types of processors such as, digital signal processor (DSP) hardware, network processor, application specific integrated circuit (ASIC), field programmable gate array (FPGA), or other types of processors. The memory 114 can be coupled to the processor 102 via a memory bus 118.

The performance counter circuit 110 can count signaled events monitored by the processor 102 as described herein. The prescaling circuit 112 can be coupled to the performance counter circuit 110 to scale the value of the generated event count according to some embodiments of the present invention.

The processor 102 performance counter circuit 110 and the prescaling circuit 112 can be configured to operate as described in some embodiments of the present invention. For example, the prescaling circuit 112 can configured to receive a first number of signaled events, generate event counts for the performance counter circuit at a current event-count rate and increase the current event-count rate in response to receiving an increment signal. The processor 102 or other logic device can be configured to determine a detected event-count rate for the signaled events based on a rate at which the first number of signaled events are received at the prescaling circuit. The processor 102 or other logic device can be configured to determine that the detected event-count rate is greater than the current event-count rate and send the increment signal to the prescaling circuit in response to determining that the detected event-count rate is greater than the current event-count rate.

The memory 114 can include a random-access semiconductor memory, storage device, or storage medium (either volatile or non-volatile) for storing or encoding data and programs. The memory 114 can be conceptually a single monolithic entity, but in some embodiments the memory 114 can be a more complex arrangement, such as a hierarchy of caches and other memory devices. The memory 114 can store data, instructions, modules, and other types of information, hereafter collectively referred to as "memory elements." Although the memory elements are illustrated as being contained within the memory 114, in some embodiments some or all of them can be on different devices and can be accessed remotely, e.g., via a network.

The computer system 100 can use virtual addressing mechanisms that allow the programs of the computer system 100 to behave as if they only have access to a large, single storage entity instead of access to multiple, smaller storage entities. Thus, while the memory elements are illustrated as being contained within the memory 114, these elements are not necessarily completely contained in the same storage device at the same time. Further, although the memory elements are illustrated as being separate entities, in some embodiments some of them, portions of some of them, or all of them can be packaged together.

In some embodiments, the memory elements can include a software application 116 and data 117. The memory elements can be instructions or statements that execute in the processor 102 to carry out some embodiments of the present invention. The software application 116 can instruct the computer processing system 100 to carry out events or processes which are monitored by the processor 102 using the performance counter circuit 110 and the prescaling circuit 112. The data 117 can be various types of data stored in memory 114. In some embodiments, the data 117 can include event counts stored from the performance counter circuit 110 and the prescaling circuit 112, described further herein.

The processor 102 can also communicate with one or more I/O devices 122 via an I/O bus 120. The I/O devices 122 can include, but are not limited to, devices such as a keyboard, a pointing device, a display, one or more devices that enable a user to interact with the computer processing system 100, and various devices (e.g., network interface card, modem, etc.) that enable the computer processing system 100 to communicate with one or more other computing devices. It should be understood that other suitable hardware and software components can be used in conjunction with the computer processing system 100.

Figure 2:
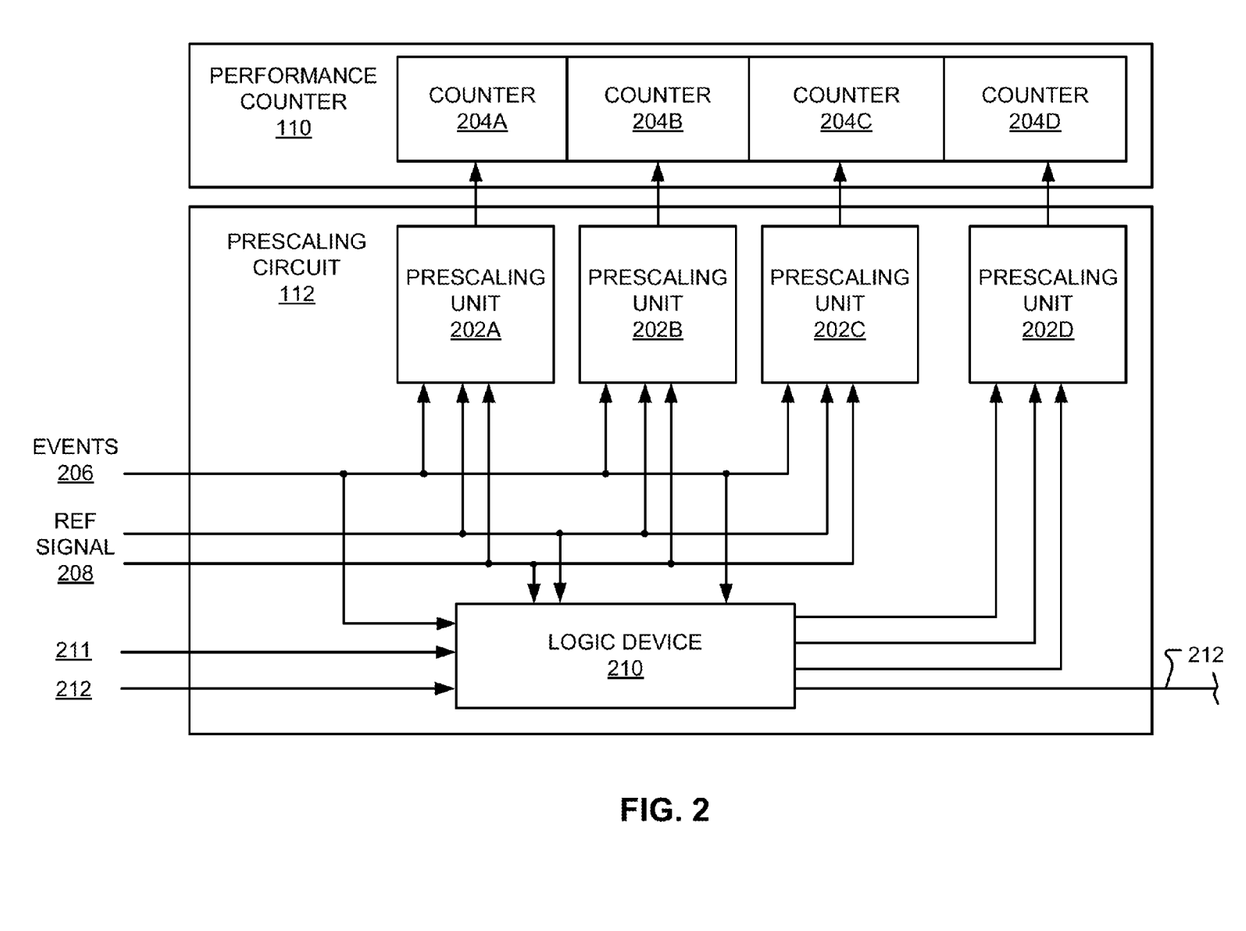
FIG. 2 depicts a performance counter circuit and a prescaling circuit according to some embodiments of the present invention.

Referring now to FIG. 2 a performance counter circuit 110 and prescaling circuit 112 can be seen according to some embodiments of the present invention. The performance counter 110 and the prescaling circuit can be the same or substantially similar as described herein. The prescaling circuit 112 can generate event counts in a set of prescaling units 202A-202D. The event counts can then be sent to and counted by a set of counters 204A-204D in the performance counter circuit 110. In some embodiments, the performance counter circuit 110 can include multiple counters, such as the set of counters 204A-204D. In certain embodiments, the performance counter circuit can include a single counter. In some embodiments, the prescaling circuit 112 can include multiple prescaling units, such as the set of prescaling units 202A-202D. In certain embodiments, the prescaling circuit can include a single prescaling unit.

The prescaling circuit 112 can receive a number of signaled events 206. The signaled events can be events and processes that are monitored by a processor 102 (FIG. 1) as described herein. In some embodiments, each of the prescaling units 202A-202D can be configured to receive and count the same signaled event 206. In some embodiments the prescaling units 202A-202D could be configured to each count different events. In certain embodiments, the signaled events can be selectable from a list of possible signaled events. For example, prescaling unit 202A could receive signaled write events, prescaling unit 202B could receive signaled read events, prescaling unit 202C could receive cache events, and prescaling unit 202D could receive bus events (events occurring in the processor bus). In some embodiments, the system could be configured to pair signaled events 206 with particular prescaling units 202A-202D based on the rate at which the signal events are expected to be generated. For example, a signaled bus event could be relatively high frequency event in comparison to read, write, and cache events. Relatively high frequency events could be sent to prescaling unit 202D which is configured to dynamically adjust the event-count rate according to some embodiments of the present invention.

The prescaling units 202A-202D in the prescaling circuit 112 can generate event counts from the number of signaled events 206 at various event-count rates. For instance, the higher the number of signaled events 206 received by the prescaling circuit 112, the lower the event-count rate. For example, when a relatively high number of signaled events is received, the prescaling units can be configured to generate event counts at an 8-bit event-count rate rather than a 4-bit event-count rate. A lower event-count rate reduces the amount of events generated in the prescaling circuit 112, which can reduce, or prevent entirely, the occurrence of overflows in the performance counter 110, as described herein.

Additionally, the lower the number of signaled events 206 received by the prescaling circuit 112 the higher the corresponding event-count rate can be set. A higher event-count rate increases the counts generated in the performance counter and can reduce the occurrence of missed signaled events in the prescaling circuit 112.

The prescaling units 202A-202D can be configured to generate event counts at different event-count rates depending upon the requirements of a user, the frequency of signaled events expected, and other factors. The prescaling units 202A-202D can receive an input signal that configures the prescaling units 202A-202D to operate at a particular event-count rate. A reference signal 208 is an example of such an input signal. For example, in the prescaling circuit 112 the reference signal 208 can be associated with a 4-bit event-count rate. Thus, when the prescaling units 202A-202D receive the reference signal 208 they will generate event counts at a 4-bit event-count rate. In certain embodiments, the reference signal 208 can be associated with various event-count rates.

The prescaling circuit 112 can receive the reference signal 208 at each of the prescaling units 202A-202D. In some embodiments, the reference signal 208 can be represented by two bits which configure the prescaling units 202A-202D between four event-count rates. For example, the prescaling units 202A-202D could be configurable between a 4-bit, 8-bit, 16-bit, and 20-bit event-count rate as described herein. A value for the two paired bits of (0,0) could be associated with the 4-bit rate, a value of (0,1) could be associated with the 8-bit rate, a value of (1,0) could be associated with the 16-bit rate, and a value of (1,1) could be associated with the 20-bit rate. However, the values of the two paired bits can be associated with various event-count rates and more bits could be used to represent additional event-count rates.

In some embodiments, particular prescaling units 202A-202D in the prescaling circuit 112 can have different event-count rates. For example, in FIG. 2 prescaling units 202A-202C receive the reference signal 208 associated with a current event-count rate. Prescaling unit 202D can have an event-count rate that is different, or independent, relative to the event-count rate associated with the reference signal 208. Logic device 210 can be configured to control the event-count rate of the prescaling unit 202D independently from the event-count rate of the reference signal 208, described further herein. In certain embodiments, each of the prescaling units 202A-202D can be individually configured with an individual, and independent, event-count rate. Various combinations of independent event-count rates for one or more of the prescaling units 202A-202D are also possible.

The prescaling circuit 112 can include a logic device 210. The logic device can be configured to communicate with one or more of the prescaling units 202A-202D and to issue commands to one or more prescaling units 202A-202D. In FIG. 2, it can be seen that logic device 210 is configured to communicate with prescaling unit 202D. In certain embodiments, the logic device 210 can be configured to communicate with one or more other prescaling units.

The logic device can configure the prescaling unit 202D to generate event counts at an event-count rate that is independent from the event-count rate of the reference signal 208. For instance, the event-count rate can be set by an adjustable input signal sent from the logic device to the prescaling unit 202D and/or to another prescaling unit.

In some embodiments, the adjustable input signal can be based on the reference signal 208. For example, the adjustable input signal can be associated with an event-count rate that is incremented or decremented relative to the event-count rate associated with the reference signal 208. For example, for a reference signal 208 associated with a 16-bit event-count rate, the logic device 210 could send an adjustable input signal incremented relative to the reference signal and associated with a 20-bit event-count rate. Further, the logic device could send an adjustable input signal decremented relative to the reference signal 208 and associated with an 8-bit event-count rate.

The logic device 210 increments or decrements the adjustable input signal relative to the reference signal 208, in response to receiving an increment/decrement signal. The increment signal and the decrement signal can be associated with an input bit 211, where one value of the input bit 211 is associated with the increment signal and another value of the input bit 211 is associated with the decrement signal.

The increment/decrement signal can be sent to the logic device 210 based on a detected event-count rate. The detected event-count rate can be an event-count rate detected for logic device 210 which is based on the frequency of signaled events 206 received at prescaling unit 202D. The detected event-count rate can be determined by determining the frequency at which the signaled events 206 received at prescaling units 202D connected to the logic device 210 relative to signaled events 206 received at one or more of prescaling units 202A-202C. For example, read events could be received at prescaling unit 202A and bus events could be received at prescaling unit 202D. The relative frequency of the events could be 200 bus events at prescaling unit 202D to 1 read event at prescaling unit 202A.

The relative frequency of signaled events at the prescaling circuits 202A-202C can be compared an upper and lower threshold rate associated with the common event-count rate set by the reference signal 208, as described herein. If the relative frequency of the signaled events 206 at prescaling unit 202D triggers the upper or lower threshold rate then the detected event-count rate is set to a decreased or increased event-count rate.

For example, read events could be received at prescaling unit 202A and bus events could be received at prescaling unit 202D. The relative frequency of the events could be 300 bus events at prescaling unit 202D to 1 read event at prescaling unit 202A. In the example, the reference signal 208 sets the event-count rate for prescaling unit 202A to an 8-bit rate. In some embodiments, the 8 bit rate could have an upper threshold rate of 150 to 1. The relative frequency of 300 bus events to 1 read event is outside of the upper threshold rate and thus the detected event-count rate could be set to a decreased event-count rate (such as a 16-bit event-count rate).

Similarly, the relative frequency of the events could be 1 bus event at prescaling unit 202D to 300 read events at prescaling unit 202A. In some embodiments, the 8-bit rate could have a lower threshold rate of 1 to 150. The relative frequency of 1 bus event to 300 read events is outside the lower threshold rate and thus the detected event-count rate could be set to an increased event-count rate (such as a 4-bit event count rate).

In some embodiments, a processor 102 (FIG. 1) can be configured to determine the detected event-count rate. The processor 102 can determine whether the detected event-count rate is greater than or less than the current event-count rate in the prescaling circuit 202D. If the detected event-count rate is greater than the current event-count rate then the processor 102 can send the increment signal to the logic device 210 using the input bit 211. If the detected event-count rate is less than the current event-count rate then the processor 102 can decrement signal to the logic device 210 using the input bit 211. The logic device 210 can increase and decrease the event-count rate in the prescaling unit 202D as described herein. Described further herein, a dynamic prescale module included in the prescaling circuit 112 can determine the detected event-count rate and transmit the toggle signal and increment and decrement signals to the logic device 210. In certain embodiments, the logic device 210 could be configured to determine the detected event-count rate.

The logic device 210 can also be toggled off so that no increment or decrement signal is sent to prescaling unit 202D and instead the reference signal 208 is sent to each the prescaling unit 202D. As seen in FIG. 2, toggle signal 212 extends through logic device and out of the prescaling circuit 112. In some embodiments, multiple prescaling circuits 112 could be connected to the toggle signal 212 and the toggle signal 212 could be used to toggle off the logic device 210 for multiple prescaling circuits 112 so that one signal is used to specify the reference signal among the multiple prescaling circuits 112. In some embodiments, the logic device 210 is toggled off in response to determining that the detected event-count rate is the same as the current event-count rate.

The logic device 210 can be toggled on or off by a toggle signal 212 sent by the processor 102. The toggle signal 212 can correspond to a toggle bit and the increment signal and the decrement signal can correspond to the input bit. The toggle bit and the input bit can be stored in a register 106 (FIG. 1). In some embodiments where the reference signal 208 corresponds to two bits, the prescaling circuit 112 can be configured using four bits (two bits for the reference signal 208, a bit for the toggle signal, and a bit for the increment and decrement signal). This can reduce the number of bits needed in a configuration register to specify control of the prescaling circuit 112. Reducing the number of bits can prove useful where registers and the number of unused bits are limited.

Figure 3:
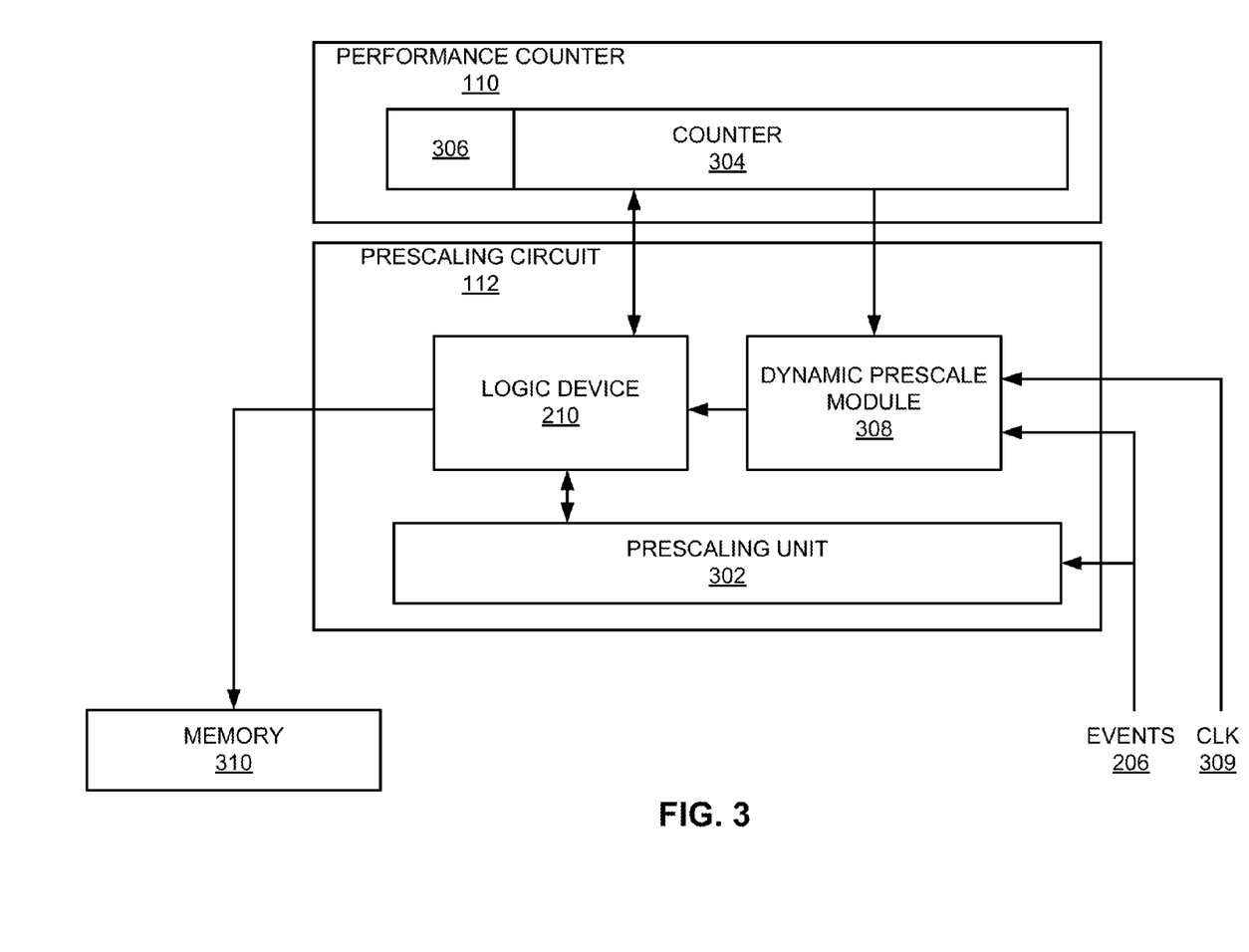
FIG. 3 depicts a performance counter circuit and a prescaling circuit including a dynamic prescale module according to some embodiments of the present invention.

Referring now to FIG. 3 a performance counter 110 and a prescaling circuit 112 including a dynamic prescaling module 308 can be seen according to some embodiments of the present invention. The prescaling circuit 112 can include a prescaling unit 302, a logic device 210, and a dynamic prescaling module 308. The performance counter 110 can include counter 304 and prescale indicator 306. The prescaling unit 302 and counter 304 can be registers for storing counts generated by the prescaling circuit 112.

The prescaling unit 302 can be configured to receive a number of signaled events 206, and is communicatively connected to the counter 304. The prescaling unit 302 can generate event counts for the counter 304 from the number of signaled events 206 at various event-count rates as described herein. In some embodiments, the prescaling unit 302 is a counter having 20-bits of storage and is configurable to generate event counts at multiple event-count rates including a 4-bit, 8-bit, 16-bit, and 20-bit event-count rate.

The prescale indicator 306 can be data stored in the counter 304 which indicates the event-count rate for the count stored in counter 304. The prescale indicator 306 can be used to determine the meaning of the count stored in the counter 304. For example, if the counter 304 has stored an event count of 5, the meaning of that event count is unknown without information regarding what event-count rate is associated with that count. If the event count was generated at an 8-bit event-count rate, an event count of 5 would translate to 1280 signaled events. However, if the event count was generated at a 4-bit event-count rate an event count of 5 would translate to 80 signaled events. In some embodiments, the prescale indicator 306 is represented by two bits in the counter 304. The value of the two bits can be associated with 4 different event-count rates of the prescaling unit 302, as described herein.

The prescaling unit 302 can be configured to count signaled event until it reaches a terminal condition in the prescaling unit 302. In some embodiments, the terminal condition occurs in the prescaling unit 302 each time the prescaling unit 302 has a total count greater than a threshold count, such as the subsequent lower event-count rate in the prescaling unit 302. For example, if the prescaling unit 302 is configured to generate counts at a 4-bit, 8-bit, 16-bit, and 20 bit event-count rate, when the prescaling unit is generating counts at the 8-bit rate the terminal condition occurs after the total count in the prescaling unit 302 exceeds $2^8$. If the prescaling unit 302 is configured to generate counts at a 16-bit event-count rate, the terminal condition occurs as the total count in the prescaling unit exceeds $2^{16}$. If the prescaling unit 302 is configured to generate counts at a 20-bit event-count rate, there is no terminal condition in the prescaling unit because the 20-bit event-count rate is the lowest event-count rate in the prescaling unit 302.

In response to reaching the terminal condition the prescaling circuit 112 can configure the prescaling unit 302 to generate counts at a decreased event-count rate. As described herein, as the event-count rate decreases, the amount of event counts generated decreases. Thus, as the prescaling unit receives more and more signaled events, the prescaling unit 302 can dynamically adjust by decreasing the event-count rate.

In response to changing the event-count rate in the prescaling unit, the prescaling circuit 112 can signal the counter 304 to change the prescale indicator 306 to correspond with the new event-count rate. Additionally, in response to the terminal condition, the counter 304 can normalize the value stored in counter 304 to reflect the changed prescale level. For example, in order to reflect the changed prescale, when decrementing from a 4-bit prescale to an 8-bit prescale, the counter 304 can normalize a value of 256 to a value of 1. As described herein, the prescale indicator 306 indicates what the count contained in counter 304 means. As the prescaling unit 302 decreases the event-count rate, each event count will translate into a higher total of signaled events. Thus, the prescale indicator 306 can change to correspond with the new event-count rate to reflect the new value of counts in the counter 304.

The prescaling circuit 112 can include a logic device 210. In some embodiments, the logic device 210 can be the same or substantially similar as described herein. The prescaling circuit 112 can include a dynamic prescale module 308. The dynamic prescale module 308 can be configured to send increment and decrement signals to the logic device 210 to configure the prescaling unit 302 to increase or decrease the event-count rate as described herein.

The dynamic prescale module 308 can include a sample counter. The sample counter can receive the number of signaled events and a clock signal 309 to determine a frequency for the signaled events 206 received over a sample period, as described herein. The frequency of signaled events 206 can be used to determine a detected event-count rate for the signaled events, as described herein. If the detected event-count rate is greater than the current event-count rate in the prescaling unit, the dynamic prescale module can send an increment signal to the logic device 210 so that the logic device 210 increases the event-count rate in the prescaling unit 302. If the detected event-count rate is less than the current event-count rate, the dynamic prescale module can send a decrement signal to the logic device 210 so that the logic device 210 decreases the event-count rate in the prescaling unit 302.

In response to increasing the event-count rate in the prescaling unit 302, the prescaling circuit 112 can normalize the count in the prescaling unit 302. For example, to generate event counts at a 4-bit rate from a prior rate of 8-bits, the prescaling unit 302 can be normalized and have the total count shifted by 4 bits so that additional counts can be generated at the 4-bit rate. If bits shifted out during are normalization are a value of 1, stored count data can be lost. In some embodiments, prior to normalizing the prescaling unit 302, the logic device 210 can read out the current value in the prescaling unit 302 to a memory 310.

Figure 4:
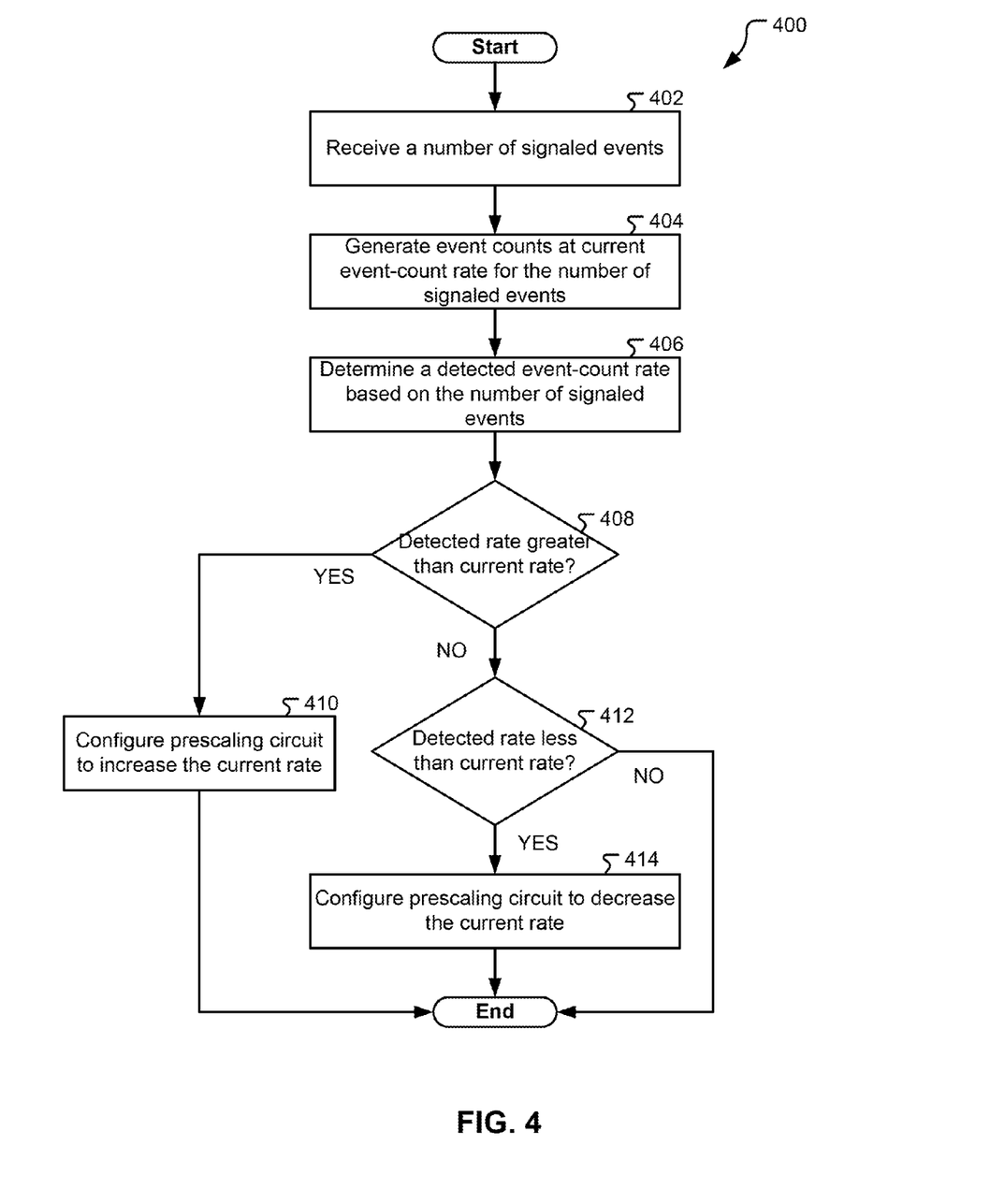
FIG. 4 depicts a flowchart diagram of a method of configuring a prescaling circuit in a performance counter circuit for a computer processing system according to some embodiments of the present invention.

Referring now to FIG. 4 a flowchart diagram of a method 400 of configuring a prescaling circuit in a performance counter circuit for a computer processing system can be seen according to some embodiments of the present invention.

In operation 402 a prescaling circuit can receive a number of signaled events. The signaled events can be signals which indicate particular events or processes monitored by a processor as described herein. The prescaling circuit can be communicatively connected with a performance counter to increase the total allowable count in the performance counter, as described herein.

In operation 404 the prescaling circuit can generate event counts at a current event-count rate for the number of signaled events. The prescaling circuit can generate event counts at various rates as described herein. The higher the event-count rate in the prescaling circuit, the fewer the number signaled events it can take to generate an event count. The lower the event-count rate, the greater the number of signaled events it can take to generate an event count.

In operation 406 a detected event-count rate can be determined based a rate of the number signaled events received by the prescaling circuit. In some embodiments, the detected event-count rate can be determined by prescaling hardware, as described herein. In certain embodiments, software can be used to determine the detected event-count rate. The detected event-count rate can be the same or substantially similar as described herein. The detected event-count rate can be determined by the frequency at which the signaled events are received by the prescaling circuit, as described herein.

If the detected event-count rate is greater than the current event-count rate then, in decision block 408, the method can progress to operation 410. If the detected event-count rate is greater than the current event-count rate then the prescaling circuit could result in missed event counts. Depending upon the event-count rate, infrequently signaled events could fail to reach the number required to generate event counts. Thus, some signaled events could fail to be reported to the performance counter. By increasing the event-count rate, the number of signaled events it takes to generate an event count can be decreased.

In operation 410, the prescaling circuit can be configured to increase the current event-count rate. The prescaling circuit can be configured to increase the current event-count rate in response to receiving an increment signal, as described herein.

If the detected event-count rate is not greater than the current event-count rate then, in decision block 408, the method 400 can progress to decision block 412. If the detected event-count rate is less than the current event-count rate then, in decision block 412, the method 400 can progress to operation 414. If the detected event-count rate is less than the current event-count rate then the prescaling circuit could result in missed event counts. Depending upon the event-count rate, frequently signaled events could result in an overflow in the performance counter, which would result in subsequent event counts failing to be recorded. By reducing the event-count rate, the number of signaled events it takes to generate an event count can be increased, and the chance of overflow in the performance counter can be decreased.

In operation 414, the prescaling circuit can be configured to decrease the current event-count rate. The prescaling circuit can be configured to reduce the current event-count rate in response to receiving a decrement signal, as described herein.

If the detected rate is not less than the current rate then, in decision block 412, the method 400 can end. Because the detected rate is not less than or greater than the current rate, the current rate must be equal to the detected rate. Thus, the current rate can be left unadjusted and the method 400 can end.

Figure 5:
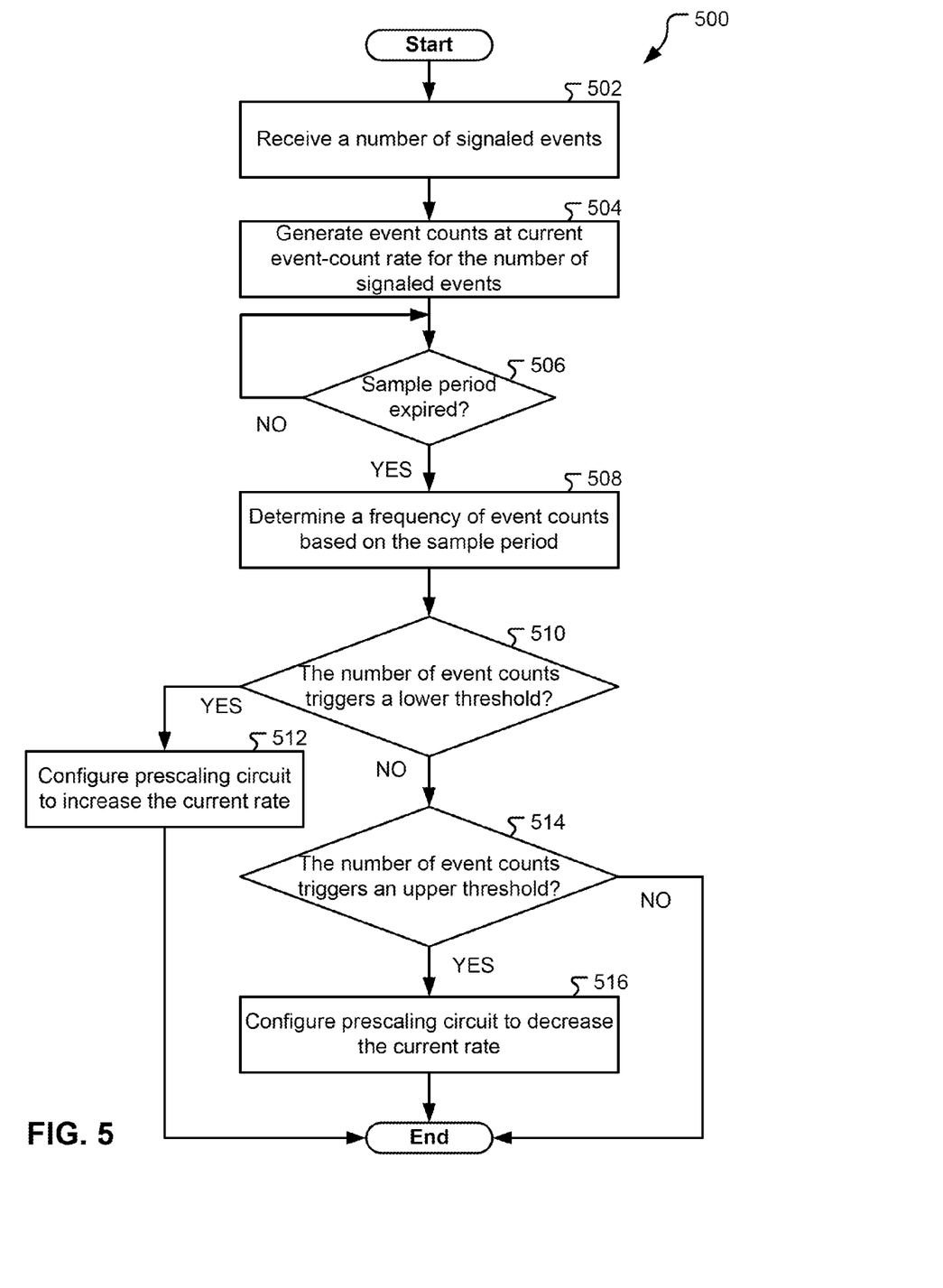
FIG. 5 depicts a flowchart diagram of a method of configuring a prescaling circuit in a performance counter circuit for a computer processing system according to some embodiments of the present invention.

Referring now to FIG. 5 a flowchart diagram of a method 500 of configuring a prescaling circuit in a performance counter circuit for a computer processing system can be seen according to some embodiments of the present invention.

In operation 502, the prescaling circuit can receive a number of signaled events and, in operation 504, the prescaling circuit can generate event counts at a current event-count rate for the number of signaled events. The signaled events can indicate events or processes as described herein. The prescaling circuit can be communicatively connected with the performance counter to reduce the frequency of event counts in the performance counter as described herein.

In decision block 506, the method 500 can wait until a sample period has expired. The sample period can be the same or substantially similar as described herein. The sample period can be a period of time used to measure frequency of signaled events received at the prescaling circuit. The greater the number of signaled events received in the sample period the greater the frequency of the signaled event. When the sample period expires the method 500 can progress to operation 508.

In operation 508, the method 500 can determine a frequency of event counts based on the sample period. The frequency of the signaled events can be determined after each time the sample period expires in order to dynamically adjust the event-count rate to meet the number of events received, as described herein.

If the number of event counts triggers a lower threshold then, in decision block 510, the method 500 can progress to operation 512. Thresholds can be associated with various frequency values for the signaled events to determine what event-count rate should be used in the prescaling circuit. In some embodiments, a lower threshold is a value for the frequency of events that indicates that the event-count rate should be increased (less signaled events needed to generate event counts).

In operation 512 the prescaling circuit can be configured to increase the current rate. The current event-count rate can be increased using an increment signal, as described herein.

If the number of event counts does not trigger the lower threshold then, in decision block 510, the method 500 can progress to decision block 514. If the number of event counts triggers an upper threshold then, in decision block 514, the method can progress to operation 516. In some embodiments, the prescaling circuit is configured at a current prescale and the upper threshold is a value for the frequency of events which indicates that the event-count rate should be decreased (more signaled events needed to generate event counts). In operation 516 the prescaling circuit can be configured to decrease the current rate. The current event-count rate can be decreased using the decrement signal, as described herein.

If the frequency does not trigger the upper or lower threshold then, in decision block 514, the method 500 can end. Because the upper and lower thresholds are not triggered the current rate is appropriate for the frequency of event counts. Thus, the current rate can be left unadjusted and the method 500 can end.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method of configuring a prescaling circuit in a performance counter circuit for a computer processing system, the method comprising:
receiving a first number of signaled events at a prescaling circuit configured to generate event counts for a performance counter circuit;
generating event counts at a current event-count rate for the first number of signaled events;
determining, upon expiration of a sample period, a first number of event counts generated during the sample period;
determining that the first number of event counts generated during the sample period triggers a lower threshold; and increasing the current event-count rate in response to determining that the number of event counts generated triggers the lower threshold.

2. The method of claim 1 further comprising:
normalizing the performance counter circuit in response to increasing the current event-count rate.

3. The method of claim 2, further comprising:
normalizing the performance counter circuit in response to decreasing the current event-count rate.

4. The method of claim 1, further comprising:
receiving a second number of signaled events at the prescaling circuit;
generating event counts at the current event-count rate for the second number of signaled events;
determining, upon expiration of the sample period, a second number of event counts generated during the sample period;
determining that the second number of event counts generated during the sample period triggers an upper threshold; and
decreasing the current event-count rate in response to determining that the second number of event counts generated triggers the lower threshold.

5. The method of claim 1, wherein the prescaling circuit includes a prescaling unit, wherein the event counts are generated at the current event-count rate in the prescaling unit and wherein the method further comprises:
determining that a terminal condition exists in the prescaling unit; and
increasing the current event-count rate in response to determining that the terminal condition exists in the prescaling unit.

6. The method of claim 5, further comprising:
normalizing the performance counter circuit in response to determining that the terminal condition exists in the prescaling unit.

7. The method of claim 1, further comprising:
receiving a second number of signaled events;
generating event counts for the performance counter circuit at a current event-count rate for the second number of signaled events; and
decreasing the current event-count rate in response to receiving a decrement signal.

8. The method of claim 7, further comprising:
determining the detected event-count rate for the signaled events based on a rate at which the second number of signaled events are received at the prescaling circuit;
determining that the detected event-count rate is less than the current event-count rate; and
sending the decrement signal to the prescaling circuit in response to determining that the detected event-count rate is less than the current event-count rate.

9. The method of claim 8, further comprising:
receiving a toggle signal; and
generating event counts at a reference event-count rate in response to receiving the toggle signal.

10. The method of claim 9, further comprising:
storing the toggle signal, the increment signal, and the decrement signal,
wherein the toggle signal corresponds to a first bit in a register and the increment signal and the decrement signal correspond to a second bit in the register.

* * * * *